United States Patent
Siegel et al.

(10) Patent No.: US 7,595,017 B2
(45) Date of Patent: Sep. 29, 2009

(54) METHOD FOR USING A PRE-FORMED FILM IN A TRANSFER MOLDING PROCESS FOR AN INTEGRATED CIRCUIT

(75) Inventors: Harry Michael Siegel, Hurst, TX (US); Anthony M. Chiu, Richardson, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 702 days.

(21) Appl. No.: 10/066,245

(22) Filed: Jan. 31, 2002

(65) Prior Publication Data

US 2003/0143406 A1     Jul. 31, 2003

(51) Int. Cl.
*B29C 45/02* (2006.01)

(52) U.S. Cl. .............. 264/272.17; 264/272.14; 264/272.15; 264/316; 264/328.4; 264/328.5; 264/338

(58) Field of Classification Search .......... 264/510, 264/511, 259, 266, 272.11, 272.14, 272.15, 264/272.17, 275, 276, 279, 279.1, 316, 328.4, 264/328.5, 337, 338; 425/89, 116, 544, 546, 425/572, 90, 96, 98
See application file for complete search history.

(56) References Cited

U.S. PATENT DOCUMENTS

| | | | | |
|---|---|---|---|---|
| 5,112,025 A | * | 5/1992 | Nakayama et al. | 249/115 |
| 5,151,276 A | * | 9/1992 | Sato et al. | 425/110 |
| 5,219,608 A | * | 6/1993 | Aoki et al. | 427/133 |
| 5,226,997 A | * | 7/1993 | Vallier | 156/228 |
| H1654 H | * | 6/1997 | Rounds | 264/511 |
| 5,674,343 A | * | 10/1997 | Hotta et al. | 156/245 |
| 5,846,477 A | * | 12/1998 | Hotta et al. | 264/511 |
| 5,891,384 A | * | 4/1999 | Miyajima | 264/511 |
| 5,955,115 A | | 9/1999 | Bolanos et al. | |
| 6,117,513 A | | 9/2000 | Hotta et al. | |
| 6,261,501 B1 | * | 7/2001 | Miyagawa et al. | 264/272.15 |
| 6,332,766 B1 | | 12/2001 | Thummel | |
| 6,544,466 B1 | * | 4/2003 | Westmoreland | 264/494 |
| 6,652,799 B2 | * | 11/2003 | Seng et al. | 264/511 |

FOREIGN PATENT DOCUMENTS

| | | |
|---|---|---|
| EP | 0 747 942 A2 | 12/1996 |
| EP | 0 977 251 A1 | 2/2000 |
| EP | 1 085 566 A1 | 3/2001 |
| EP | 1 113 490 A2 | 7/2001 |

* cited by examiner

*Primary Examiner*—Edmund H. Lee
(74) *Attorney, Agent, or Firm*—Lisa K. Jorgenson; William A. Munck

(57) ABSTRACT

A system and method is disclosed for using a pre-formed film in a transfer molding process of the type that uses a transfer mold to encapsulate portions of an integrated circuit with a molding compound. A film of compliant material is pre-formed to conform the shape of the film to a mold cavity surface of the transfer mold. The pre-formed film is then placed adjacent to the surfaces of the mold cavity of the transfer mold. The mold cavity is filled with molding compound and the integrated circuit is encapsulated. The pre-formation of the film allows materials to be used that are not suitable for use with prior art methods.

21 Claims, 4 Drawing Sheets

METHOD FOR USING A PRE-FORMED FILM IN A TRANSFER MOLDING PROCESS FOR AN INTEGRATED CIRCUIT

TECHNICAL FIELD OF THE INVENTION

The present invention is directed, in general, to integrated circuits and, more specifically, to a system and method for using a pre-formed film in a transfer molding process for an integrated circuit.

BACKGROUND OF THE INVENTION

Transfer molding of thermo setting plastics is a well known and commonly used technique for packaging an integrated circuit (IC). The transfer molding process molds a liquefied plastic material around portions of an IC. A transfer mold is placed over the IC and the transfer mold is filled with liquefied thermosetting plastic material. After the liquefied thermosetting plastic material has been compacted and solidified, the transfer mold is removed from the IC. The solidified plastic material provides mechanical and environmental protection for the encapsulated IC. An exemplary transfer molding process will be more fully described with reference to FIGS. 1 though 5.

Advances in molding technology have provided a number of methods for producing openings in plastic parts that expose selected areas of an integrated circuit chip. These openings are essential in applications where the functionality of the integrated circuit device relies on having physical, environmental or optical access directly to the surface of the integrated circuit. Examples of devices that need such access include, without limitation, cameras that use CMOS chips and CCD chips, pressure transducers, and biometric sensors that rely on capacitative coupling (e.g., for the detection of finger prints).

There are two basic types of transfer molding techniques for producing exposed IC surfaces. In both types it is necessary to exclude plastic from selected areas of the IC surface. To do this it is necessary to contact or clamp the delicate IC die surface with part of the transfer mold. However, transfer molds are usually made of hardened steel so that any surface of the transfer mold that makes contact with the delicate IC die surface is firm and unyielding. The transfer mold does not accommodate the normal dimensional variations that exist in the height and location of the IC die surface. This means that when the transfer mold contacts the IC die surface, the transfer mold usually causes damage to the IC die surface.

A first type of transfer molding technique addresses this problem by providing a compliant material in those areas where the transfer mold contacts the IC die surface. The compliant material is semi-permanently attached to the face of the transfer mold where the transfer mold contacts the IC die surface. The compliant material cushions the clamping action of the transfer mold against the IC die surface.

For example, cushions made of silicone can be attached to the transfer mold in the critical contact areas where the transfer mold contacts the IC die surface. See, for example, U.S. Pat. No. 5,897,338. This type of technique is referred to as the "soft insert" molding technique. There are some problems, however, with the soft insert molding technique. Silicone is a soft material and wears rapidly. It must be replaced often. Replacement of the silicone material is a relatively expensive task. In addition, the soft silicone material can collect embedded particles over time. These embedded particles can damage the delicate IC die surface.

A second type of transfer molding technique provides cushioning to the areas where the transfer mold clamps the IC die surface by providing a renewable compliant film that covers the surface of the transfer mold. A new film is placed over the surface of the transfer mold each time the transfer mold is used. Therefore, the transfer mold always presents a new clean compliant surface to each IC die surface on which it is used.

The compliant film is usually in the form a continuously fed tape. The transfer mold is placed over a portion of the film tape. Special pins and vacuum ports in the transfer mold must be provided to stretch the film, shape the film into the desired form, and hold the film in place against the contours of the surfaces of the mold cavity of the transfer mold. This is necessary to conform the film to the contours of the inner surface of the mold cavity at the time that the transfer mold process occurs. This process is referred to as the "film assisted molding" ("FAM") technique. See, for example, U.S. Pat. No. 5,800,841. The FAM technique limits the type of materials that may be used because not all types of compliant material can be successfully stretched and formed using the FAM technique.

There is therefore a need in the art for a system and method for providing an improvement to the transfer molding process known as "film assisted molding."

SUMMARY OF THE INVENTION

To address the deficiencies of the prior art, it is a primary object of the present invention to provide a system and method for using a pre-formed film in a transfer molding process for an integrated circuit known as "film assisted molding."

The present invention generally comprises an improved system and method for manufacturing an encapsulated integrated circuit. The system and method of the present invention uses a pre-formed film in the transfer molding process. A film of compliant material is pre-formed to conform the shape of the film to a mold cavity surface of the transfer mold. The pre-formed film is placed adjacent to the surfaces of the mold cavity of the transfer mold. The mold cavity is then filled with liquefied molding compound and the integrated circuit is encapsulated. The encapsulated integrated circuit is removed from the transfer mold after the molding compound has solidified.

It is an object of the present invention to provide an improved system and method for "film assisted molding" by providing a pre-formed film to be placed adjacent to the surfaces of a mold cavity of a transfer mold.

It is also an object of the present invention to provide an improved system and method for "film assisted molding" by pre-forming a film of compliant material in advance of a transfer mold process.

It is another object of the present invention to provide an improved system and method for "film assisted molding" by pre-forming a film using materials that can not be used by prior art methods.

It is another object of the present invention to provide an improved system and method for "film assisted molding" by providing a tape made up of film of compliant material in which portions of the tape are pre-formed to conform each portion of the tape to a mold cavity surface of a transfer mold.

It is yet another object of the present invention to provide an improved system and method for "film assisted molding" by providing a pre-formed film for a top half of a transfer mold and by providing a pre-formed film for a bottom half of a transfer mold.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art will appreciate that they may readily use the concepts and the specific embodiment disclosed as a basis for modifying or designing other structures for carrying out the same purposes of the present invention. Those skilled in the art will also realize that such equivalent constructions do not depart from the spirit and scope of the invention in its broadest form.

Before undertaking the DETAILED DESCRIPTION OF THE INVENTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior uses, as well as to future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

FIGS. 1 through 9, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged integrated circuit.

Figure 1:
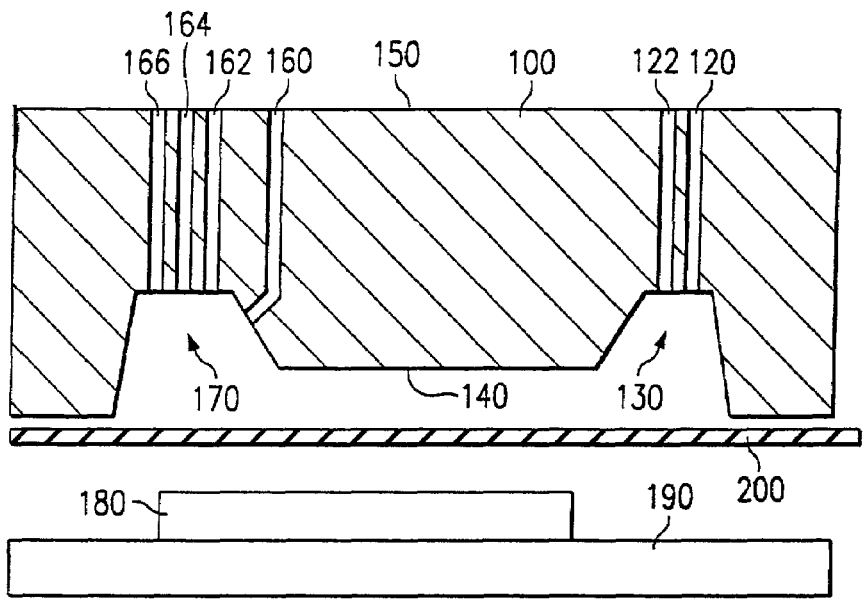
FIG. 1 illustrates a sectional side view of an exemplary prior art transfer mold placed over an integrated circuit die on an integrated circuit substrate, and a prior art film of compliant material placed between the transfer mold and the integrated circuit die.

FIG. 1 illustrates a sectional side view of an exemplary prior art transfer mold 100. Exemplary transfer mold 100 comprises portions that form a channel 120 and a channel 122 that extend through the body of transfer mold 100. Channel 120 and channel 122 extend from a first mold cavity region 130 formed by the lower surface 140 of transfer mold 100 to the upper exterior surface 150 of transfer mold 100.

Exemplary transfer mold 100 also comprises portions that form channels 160, 162, 164 and 166 that extend through the body of transfer mold 100. Channels 160, 162, 164 and 166 extend from a second mold cavity region 170 formed by the lower surface 140 of transfer mold 100 to the upper exterior surface 150 of transfer mold 100.

FIG. 1 also illustrates an integrated circuit die 180 mounted on an integrated circuit substrate 190. For clarity circuit connections between integrated circuit die 180 and integrated circuit substrate 190 are not shown. FIG. 1 also illustrates a prior art flat film 200 made of compliant material such as a fluorocarbon. A prior art "film assisted molding" technique begins by placing film 200 under the transfer mold 100. That is, film 200 is placed between the transfer mold 100 and the integrated circuit die 180 on integrated circuit substrate 190.

As shown in FIG. 1, film 200 completely covers the lower surface 140 of transfer mold 100. Film 200 is placed across the bottom of transfer mold 100 so that film 200 seals mold cavity region 130 and mold cavity region 170. At this point mold cavity region 130 has access to the atmosphere through channel 120 and channel 122 and mold cavity region 170 has access to the atmosphere through channels 160, 162, 164 and 166.

Figure 2:
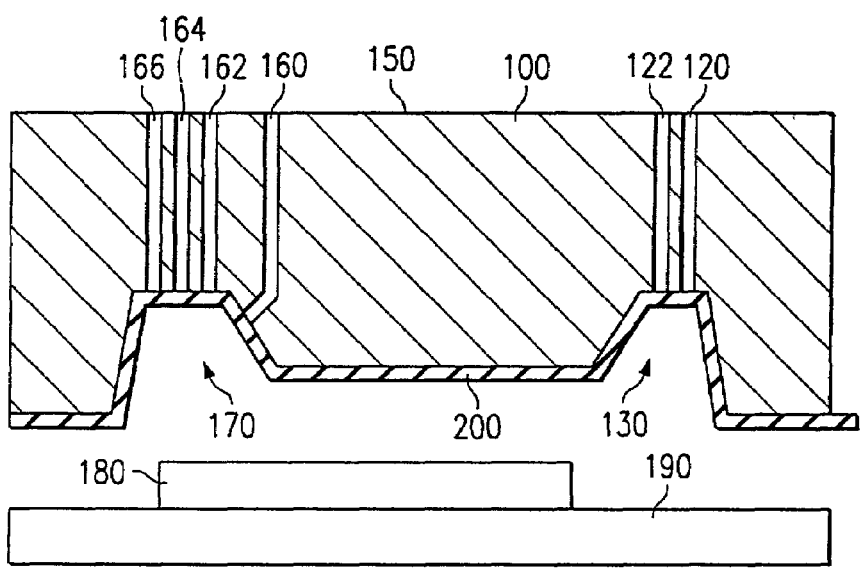
FIG. 2 illustrates a sectional side view of an exemplary prior art transfer mold in which a prior art film has been stretched and fitted into place against the contours of the mold cavity of the transfer mold using a prior art method.

A vacuum pump (not shown) is connected to the openings of channels 120, 122, 160, 162, 164 and 166 in the upper exterior surface 150 of transfer mold 100. The vacuum pump is activated to pump out the air from within mold cavity region 130 and from within mold cavity region 170. As the air is removed through the channels 120, 122, 160, 162, 164 and 166, the atmospheric pressure on the external surface of film 200 forces film 200 against the lower surface 140 of transfer mold 100. As shown in FIG. 2, film 200 stretches and becomes fitted into place against the mold contours of the lower surface 140 of transfer mold 100.

Figure 3:
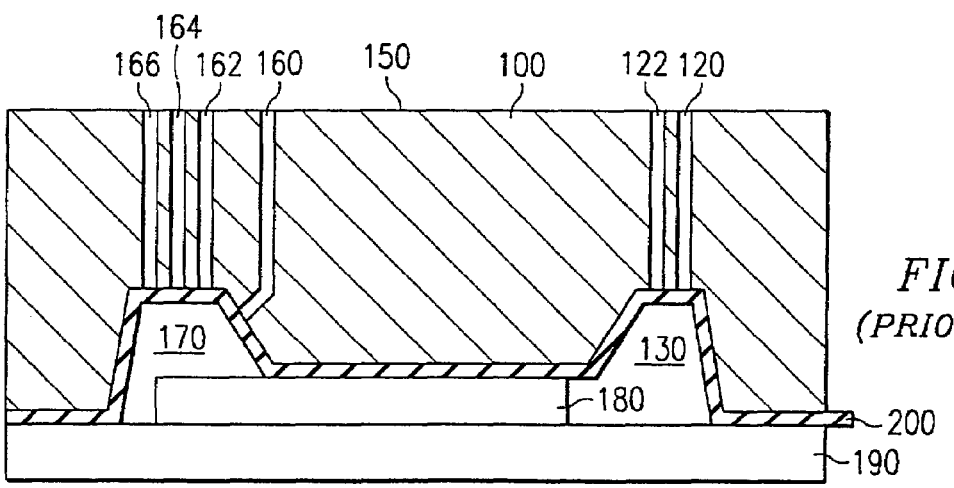
FIG. 3 illustrates a sectional side view of an exemplary prior art transfer mold fitted with a prior art film lowered into place over an integrated circuit die on an integrated circuit substrate.

After film 200 has been fitted into place against the mold contours of the lower surface 140 of transfer mold 100, transfer mold 100 is lowered into position on top of integrated circuit die 180 and integrated circuit substrate 190. FIG. 3 illustrates how transfer mold 100 fits into place over integrated circuit die 180 and integrated circuit substrate 190. Film 200 rests on the surface of integrated circuit die 180 and protects it from touching the body of transfer mold 100. In the example shown in FIG. 3, the left end portion of integrated circuit die 180 extends into mold cavity region 170.

Figure 4:
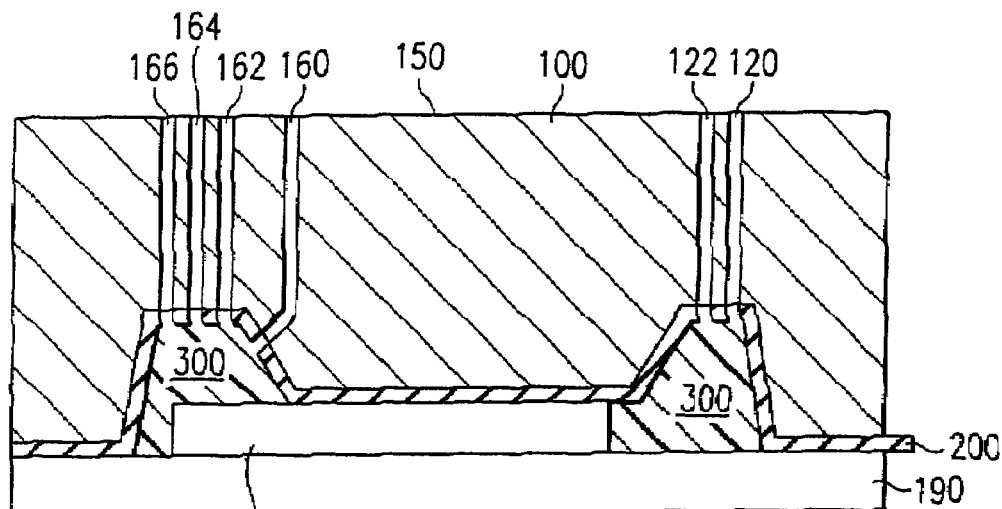
FIG. 4 illustrates a sectional side view of an exemplary prior art transfer mold lowered into place over an integrated circuit die on an integrated circuit substrate in which the cavity or cavities of the transfer mold are filled with plastic molding compound.

FIG. 4 illustrates a sectional side view of transfer mold 100 lowered into place over integrated circuit die 180 and integrated circuit substrate 190 in which mold cavity region 130 and mold cavity region 170 have been filled with molding compound. The molding compound usually comprises thermo setting plastic material 300. Liquefied plastic material 300 is injected under pressure into mold cavity 130 and into mold cavity region 170 through one or more separate channels (not shown) through transfer mold 100.

Figure 5:
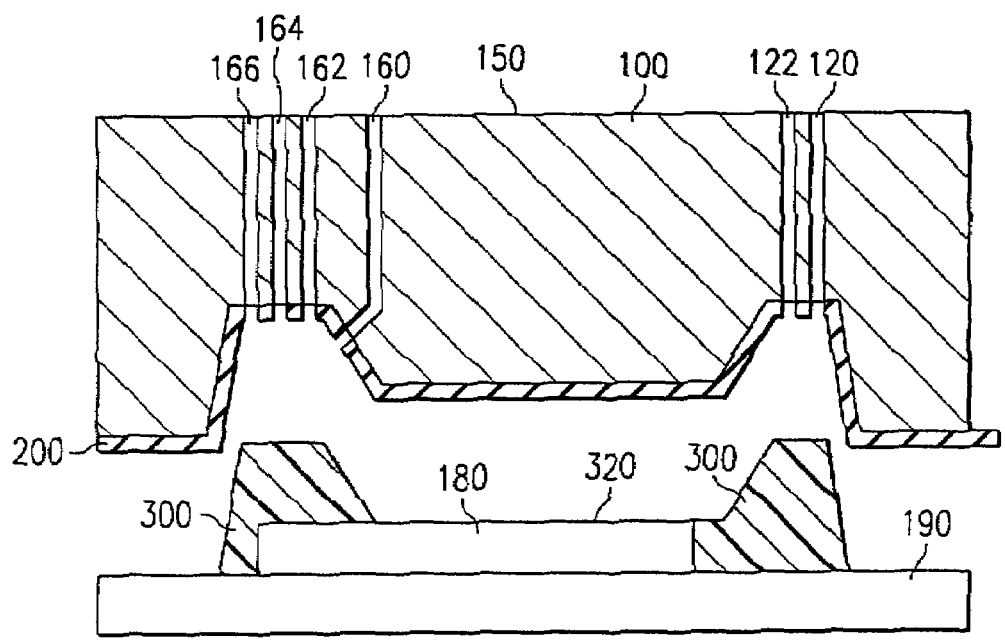
FIG. 5 illustrates a sectional side view of the exemplary prior art transfer mold shown in FIG. 4 separated from a combination of an integrated circuit die and an integrated circuit substrate on which plastic material has been molded.

As shown in FIG. 5, after the liquefied plastic material 300 within mold cavity region 130 and within mold cavity region 170 has been compacted and solidified, the transfer mold 100 is separated from the combination that comprises integrated circuit die 180, integrated circuit substrate 190, and solidified plastic material 300. The solidified plastic material 300 provides mechanical and environmental protection for the integrated circuit die 180. As also shown in FIG. 5, an exposed portion 320 of integrated circuit die 180 remains open to the atmosphere.

The foregoing describes an exemplary prior art "film assisted molding" ("FAM") technique. As previously mentioned, the FAM technique limits the type of materials that may be used because not all types of compliant material can be successfully stretched and formed using the above described FAM technique.

Figure 6:
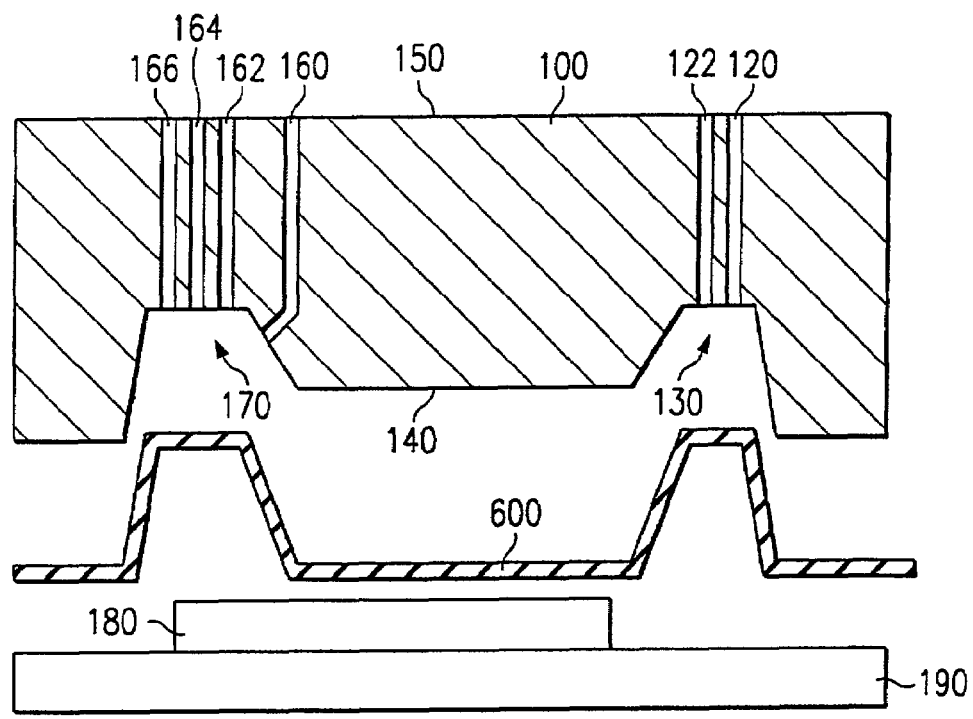
FIG. 6 illustrates a sectional side view of a transfer mold placed over an integrated circuit die on an integrated circuit substrate, and an advantageous embodiment of a pre-formed film of compliant material of the present invention.

FIG. 6 illustrates a pre-formed film 600 of the present invention to produce exposed surfaces after molding in an integrated circuit. In accordance with the principles of the present invention, film 600 is pre-formed into the shape of the cavity of transfer mold 100 before film 600 is placed into position within transfer mold 100. Film 600 is pre-formed by embossing, stamping, or otherwise forming the normally flat tape into an approximate shape of the cavity of transfer mold 100. In contrast, the prior art FAM technique forces prior art film 200 to conform to the cavity shape of transfer mold 100 at the time the molding process is carried out.

The pre-formation of film 600 in accordance with the principles of the present invention allows the use of materials that are not suitable for use with prior art FAM techniques. For example, certain materials are too stiff to successfully be used as a film using prior art FAM techniques.

A specific example of such a material is silicone coated latex saturated paper liners. Such paper liners are commercially available (e.g., Loparex 2-60SF-157 and Loparex 2-60SF-168B). The pre-formation process of the present invention (e.g., embossing) is performed while the film edges are unconstrained. This enables the silicone coated latex saturated paper liners to more easily accommodate the necessary deformations.

In addition, pre-forming film 600 with the cavity shape of transfer mold 100 substantially reduces the requirements of the prior art FAM technique for tape pinning, tape stretching, and vacuum holding. The pre-formed shape of film 600 need only approximate the cavity shape of transfer mold 100. This is because during the FAM process (1) vacuum holding will cause film 600 to adhere to the surfaces of the mold cavity of transfer mold 100, and (2) injection of molding compound 300 under pressure will force film 600 to conform to the shape of the mold cavity of transfer mold 100.

The pre-formation of film 600 may be achieved by a number of prior art processes. One advantageous process for pre-forming film 600 is the process of embossing. Film embossing is able to accommodate many of the features normally encountered in transfer molding. Special care in designing transfer mold 100 (e.g., providing generous draft angles and generous radii) will facilitate the successful insertion and molding of pre-formed film 600.

The pre-forming operation for pre-forming film 600 may be implemented immediately before the molding process. An embossing tool (not shown) may be used to pre-form film 600 into a shape that conforms to the shape of the mold cavity of transfer mold 100 just before the film 600 is placed within transfer mold 100. Alternatively, the pre-forming operation for pre-forming film 600 may be implemented separately and well in advance of the transfer molding process.

Figure 7:
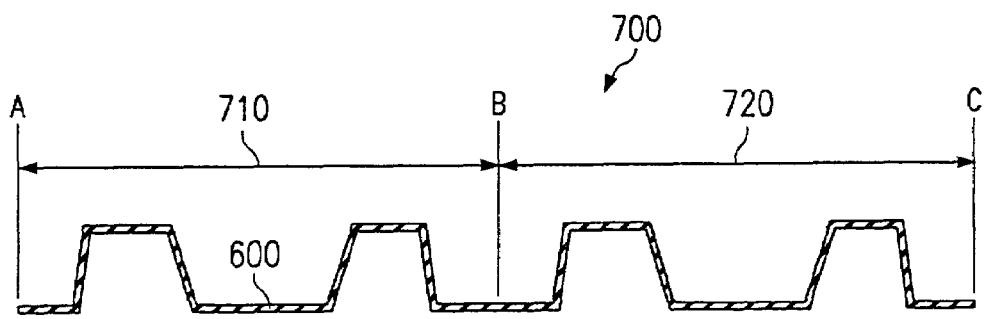
FIG. 7 illustrates an advantageous embodiment of a continuous tape comprising two units of the pre-formed film of the present invention.

As shown in FIG. 7, film 600 may be pre-formed in the form of a continuous tape 700. First unit 710 of tape 700 (from A to B) represents a first unit of film 600. Similarly, second unit 720 of tape 700 (from B to C) represents a second unit of film 600. Tape 700 may be manufactured with as many units of film 600 as desired. Tape 700 may then be cut to convenient lengths. Robotic techniques may be used to pick up a pre-cut length of tape 700 and sequentially feed individual units of film 600 into transfer mold 100.

Only one unit of film 600 is used for each integrated circuit that undergoes the transfer molding process. That is, a new unit of film 600 is placed over the lower surface 140 of transfer mold 100 each time transfer mold 100 is used. In this way transfer mold 100 always presents a new clean compliant surface of film 600 to each integrated circuit die 180 that is processed.

Figure 8:
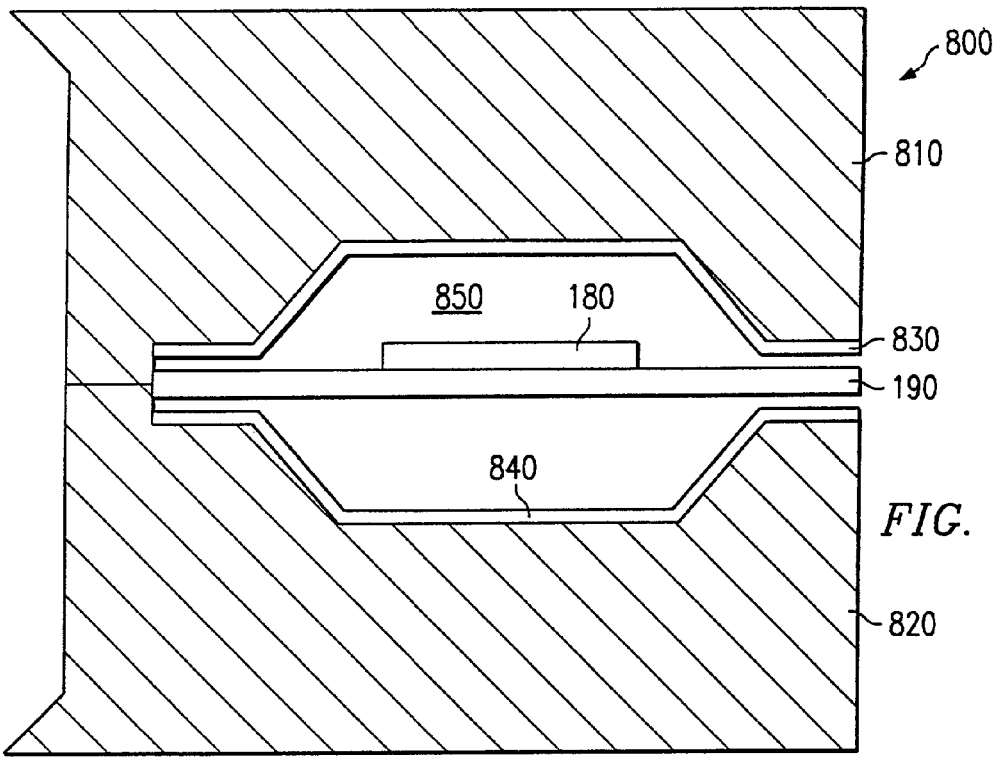
FIG. 8 illustrates an alternate advantageous embodiment of the present invention.

FIG. 8 illustrates an alternate advantageous embodiment of the present invention. The principles of the present invention can be used to mold conventional plastic packages with leadframes. Such packages include, without limitation, Dual In Line Packages (DIPS), Small Out Line Packages, Thin Small Out Line Packages, Plastic Quad Flat Pack (PQFP) Packages, and other types of packages.

FIG. 8 illustrates a portion of a transfer mold 800 that comprises a top half 810 and a bottom half 820. An integrated circuit die 180 is mounted on an integrated circuit substrate 190 and placed between the top half 810 and the bottom half 820 of transfer mold 800. When top half 810 and bottom half 820 of transfer mold 800 are placed together they form mold cavity 850.

In this alternate advantageous embodiment of the present invention (1) pre-formed film 830 of the present invention is placed against the lower surface of the top half 810 of transfer mold 800, and (2) pre-formed film 840 of the present invention is placed against the upper surface of the bottom half 820 of transfer mold 800. In this particular alternate embodiment, molding compound (not shown in FIG. 8) is introduced into mold cavity 850 through a passageway formed between pre-formed film 830 and integrated circuit substrate 190 (and through a passageway formed between pre-formed film 840 and integrated circuit substrate 190).

In this manner the pre-formed film 830 on the top half 810 of transfer mold 800 and the pre-formed film 840 on the bottom half 820 of transfer mold 800 protect the opposite sides of mold cavity 850 from plastic "staining." Pre-formed film 830 and pre-formed film 840 help seal the clamping areas along the dam bar and therefore help prevent resin bleed.

Figure 9:
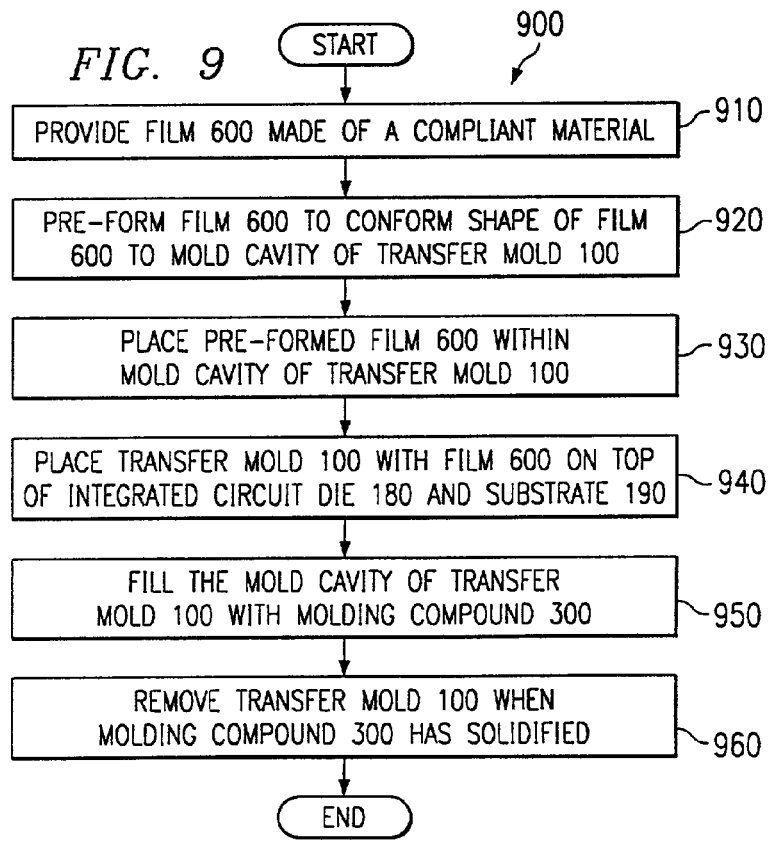
FIG. 9 illustrates a flow chart of an advantageous embodiment of a method of the present invention for providing pre-formed film to produce exposed surfaces after molding in an integrated circuit.

FIG. 9 illustrates a flow chart of an advantageous embodiment of a method of the present invention for using a pre-formed film in a transfer molding process for an integrated circuit. The steps of the method are generally denoted with reference numeral 900.

The first step of the method is to provide a film 600 of compliant material (step 910). Then film 600 is pre-formed to conform the shape of film 600 to the surface of the mold cavity of transfer mold 100 (step 920). Then pre-formed film 600 is placed within the mold cavity of transfer mold 100 (step 930). As previously described, pre-formed film 600 may be held in place within the mold cavity of transfer mold 100 by applying a vacuum to channels 120, 122, 160, 162, 164 and 166 of transfer mold 100.

Then transfer mold 100 is placed on top of integrated circuit die 180 and substrate 190 (step 940). Pre-formed film 600 then covers the surfaces of integrated circuit die 180 and substrate 190. The mold cavity of transfer mold 100 is then filled with molding compound 300 through one or more separate channels (not shown) through transfer mold 100 (step 950). Then transfer mold 100 is removed from integrated circuit die 180 and substrate 190 when the molding compound 300 has solidified (step 960).

Although the present invention has been described in detail, those skilled in the art will understand that various changes, substitutions, and alterations herein may be made without departing from the spirit and scope of the invention it its broadest form.

What is claimed is:

1. A method comprising:
   pre-forming a film of compliant material to at least approximately conform a shape of the film to a mold cavity surface of a transfer mold adapted for use in encapsulating portions of an integrated circuit within a molding compound;
   placing the pre-formed film of compliant material adjacent to the mold cavity surface of the transfer mold; and
   vacuum holding the pre-formed film of compliant material against the mold cavity surface of the transfer mold.

2. The method as set forth in claim 1 wherein pre-forming the film of compliant material is carried out immediately before the film is placed adjacent to the mold cavity surface.

3. The method as set forth in claim 1 wherein pre-forming the film of compliant material comprises one of: embossing the film and stamping the film.

4. The method as set forth in claim 1 further comprising:
   placing the transfer mold and pre-formed film over an integrated circuit die;
   filling a region adjacent to a portion of the pre-formed film within the mold cavity of the transfer mold with liquefied molding compound;
   allowing the molding compound to solidify; and
   removing the transfer mold from the integrated circuit die after the molding compound has solidified.

5. A method comprising:
   providing a tape made of a film of compliant material;
   without separating the tape into a plurality of portions, pre-forming a plurality of regions along the tape to at least approximately conform a shape of a part of each region to a mold cavity of a transfer mold adapted for use in encapsulating portions of an integrated circuit within a molding compound; and
   placing one of the plurality of regions of the tape adjacent to the mold cavity surface.

6. The method as set forth in claim 5 wherein pre-forming the part of the region of the tape is carried out immediately before the region of the tape is placed adjacent to the mold cavity surface.

7. The method as set forth in claim 5, further comprising:
   pre-forming another part of each region along the tape to a shape that approximately conforms to a shape of portions of the transfer mold surrounding the mold cavity, wherein a mold cavity surface for the transfer mold includes a surface of the mold cavity within the transfer mold and a surface of the portions of the transfer mold surrounding the mold cavity.

8. The method as set forth in claim 5 wherein pre-forming the part of each region along the tape comprises one of:
   embossing the portion of the tape and stamping the portion of the tape.

9. The method as set forth in claim 5 further comprising:
   placing the transfer mold and one pre-formed region of the tape over an integrated circuit die;
   filling a region adjacent to a portion of the pre-formed region of the tape within the mold cavity of the transfer mold with liquefied molding compound;
   allowing the molding compound to solidify; and
   removing the transfer mold from the integrated circuit die after the molding compound has solidified.

10. A method comprising:
    providing a first film of compliant material;
    pre-forming the first film of compliant material to at least approximately conform a shape of the first film to a mold cavity surface of a top half of a transfer mold adapted for use in encapsulating portions of an integrated circuit within a molding compound;
    placing the pre-formed first film of compliant material adjacent to the mold cavity surface of the top half of the transfer mold;
    providing a second film of compliant material;
    pre-forming the second film of compliant material to at least approximately conform a shape of the second film to a mold cavity surface of a bottom half of the transfer mold;
    placing the pre-formed second film of compliant material adjacent to and supported by the mold cavity surface of the bottom half of the transfer mold; and
    vacuum holding the pre-formed first film of compliant material against the mold cavity surface of the top transfer mold.

11. The method as set forth in claim 10 wherein pre-forming the first film of compliant material is carried out immediately before the first film is placed adjacent to the mold cavity surface of the top half of the transfer mold; and
    wherein pre-forming the second film of compliant material is carried out before the second film is placed adjacent to the mold cavity surface of the bottom half of the transfer mold.

12. The method as set forth in claim 10 wherein pre-forming the first film of compliant material comprises one of: embossing the first film and stamping the first film; and
    wherein pre-forming the second film of compliant material comprises one of: embossing the second film and stamping the second film.

13. The method as set forth in claim 10 further comprising:
    placing the top half of the transfer mold and pre-formed first film and the bottom half of the transfer mold and pre-formed second film around an integrated circuit die to form a mold cavity around the integrated circuit die;
    filling a region adjacent to portions of the pre-formed first and second films within the mold cavity of the transfer mold with liquefied molding compound;
    allowing the molding compound to solidify; and
    removing the transfer mold from the integrated circuit die after the molding compound has solidified.

14. The method of claim 1, wherein:
- pre-forming the film comprises pre-forming a plurality of portions of the film to at least approximately conform a shape of each of the plurality of portions of the film to the mold cavity surface of the transfer mold; and
- placing the pre-formed film within the transfer mold comprises placing one of the plurality of portions of the film within the transfer mold.

15. The method of claim 14, further comprising cutting the pre-formed film to separate at least some of the plurality of portions of the film.

16. The method of claim 5, further comprising cutting the pre-formed tape to separate at least some of the plurality of portions of the tape.

17. The method of claim 5, wherein the film comprises a silicone coated latex saturated paper liner.

18. The method of claim 10, wherein:
- pre-forming the first film comprises pre-forming a plurality of portions of the first film to at least approximately conform a shape of each of the plurality of portions of the first film to the mold cavity surface of the top half of the transfer mold;
- placing the pre-formed first film within the top half of the transfer mold comprises placing one of the plurality of portions of the first film within the top half of the transfer mold;
- pre-forming the second film comprises pre-forming a plurality of portions of the second film to at least approximately conform a shape of each of the plurality of portions of the second film to the mold cavity surface of the bottom half of the transfer mold; and
- placing the pre-formed second film within the bottom half of the transfer mold comprises placing one of the plurality of portions of the second film within the bottom half of the transfer mold.

19. The method of claim 18, further comprising:
- cutting the pre-formed first film to separate at least some of the plurality of portions of the first film; and
- cutting the pre-formed second film to separate at least some of the plurality of portions of the second film.

20. The method of claim 10, wherein:
- each of the first and second films comprises a silicone coated latex saturated paper liner; and
- pre-forming the first and second films comprises pre-forming the silicone coated latex saturated paper liners while edges of the films are unconstrained.

21. The method of claim 4, wherein:
- the vacuum holding causes the pre-formed film of compliant material to adhere to at least part of the mold cavity surface; and
- the filling of the mold cavity with the liquefied molding compound causes the pre-formed film of compliant material to conform to the shape of the mold cavity surface.

\* \* \* \* \*

UNITED STATES PATENT AND TRADEMARK OFFICE
CERTIFICATE OF CORRECTION

PATENT NO. : 7,595,017 B2
APPLICATION NO. : 10/066245
DATED : September 29, 2009
INVENTOR(S) : Siegel et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 726 days.

Signed and Sealed this

Fourteenth Day of December, 2010

David J. Kappos
*Director of the United States Patent and Trademark Office*